(12) United States Patent
Toyoda et al.

(10) Patent No.: US 10,340,730 B2
(45) Date of Patent: Jul. 2, 2019

(54) UNINTERRUPTIBLE POWER SUPPLY APPARATUS

(71) Applicant: TOSHIBA MITSUBISHI-ELECTRIC INDUSTRIAL SYSTEMS CORPORATION, Tokyo (JP)

(72) Inventors: Masaru Toyoda, Chuo-ku (JP); Masahiro Kinoshita, Chuo-ku (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 233 days.

(21) Appl. No.: 15/517,106

(22) PCT Filed: Nov. 27, 2014

(86) PCT No.: PCT/JP2014/081313
§ 371 (c)(1),
(2) Date: Apr. 5, 2017

(87) PCT Pub. No.: WO2016/084179
PCT Pub. Date: Jun. 2, 2016

(65) Prior Publication Data
US 2017/0310152 A1    Oct. 26, 2017

(51) Int. Cl.
*H02J 3/46*    (2006.01)
*H02J 7/34*    (2006.01)
(Continued)

(52) U.S. Cl.
CPC .............. *H02J 7/34* (2013.01); *H02J 3/46* (2013.01); *H02J 9/06* (2013.01); *H02J 9/062* (2013.01);
(Continued)

(58) Field of Classification Search
CPC ........ H02J 9/06; H02J 3/46; H02J 7/34; H02J 9/062; H05K 7/2089; H02M 5/458; H02M 7/003
See application file for complete search history.

(56) References Cited

U.S. PATENT DOCUMENTS

2008/0157598 A1* 7/2008 Kuitani ................. H02J 3/1814
  307/45
2011/0227418 A1* 9/2011 Pyboyina ................ H02J 9/062
  307/75

(Continued)

FOREIGN PATENT DOCUMENTS

CN    103036243 A    4/2013
EP    2 582 013 A2    4/2013
(Continued)

OTHER PUBLICATIONS

Extended European Search Report dated Jul. 23, 2018 in European Patent Application No. 14906685.4, citing document AO therein, 7 pages.

(Continued)

*Primary Examiner* — Jared Fureman
*Assistant Examiner* — Duc M Pham
(74) *Attorney, Agent, or Firm* — Oblon, McClelland, Maier & Neustadt, L.L.P.

(57) ABSTRACT

An uninterruptible power supply apparatus includes a converter (5) configured to convert AC power into DC power, and an inverter (10) configured to convert DC power into AC power and supply the converted power to a load (24). The load (24) is configured to receive an AC voltage within a range of allowable input voltage to consume constant AC power. The uninterruptible power supply apparatus has maximum efficiency η when a ratio of load capacity to rated capacity of the uninterruptible power supply apparatus is a predetermined value α. The uninterruptible power supply (Continued)

apparatus further includes a control device (18) configured to control an output voltage of the inverter (10) within the range of allowable input voltage so as to increase the efficiency $\eta$, when the ratio of the load capacity to the rated capacity is different from the predetermined value $\alpha$.

8 Claims, 6 Drawing Sheets

(51) Int. Cl.
  *H02J 9/06* (2006.01)
  *H02M 7/00* (2006.01)
  *H05K 7/20* (2006.01)
  *H02M 5/458* (2006.01)
(52) U.S. Cl.
  CPC ........... *H02M 5/458* (2013.01); *H02M 7/003* (2013.01); *H05K 7/2089* (2013.01)

(56) References Cited

U.S. PATENT DOCUMENTS

2012/0306274 A1* 12/2012 Shetler, Jr. .............. H02J 9/062
  307/64
2013/0088900 A1 4/2013 Park

FOREIGN PATENT DOCUMENTS

EP  2582013 A2  4/2013
JP  2010-124557 A  6/2010

OTHER PUBLICATIONS

International Search Report dated Jan. 13, 2015 in PCT/JP2014/081313 filed Nov. 27, 2014.
Chinese Search Report dated Dec. 26, 2018 in Chinese Application No. CN201480083750.8 (With English Translation).

\* cited by examiner

FIG.5
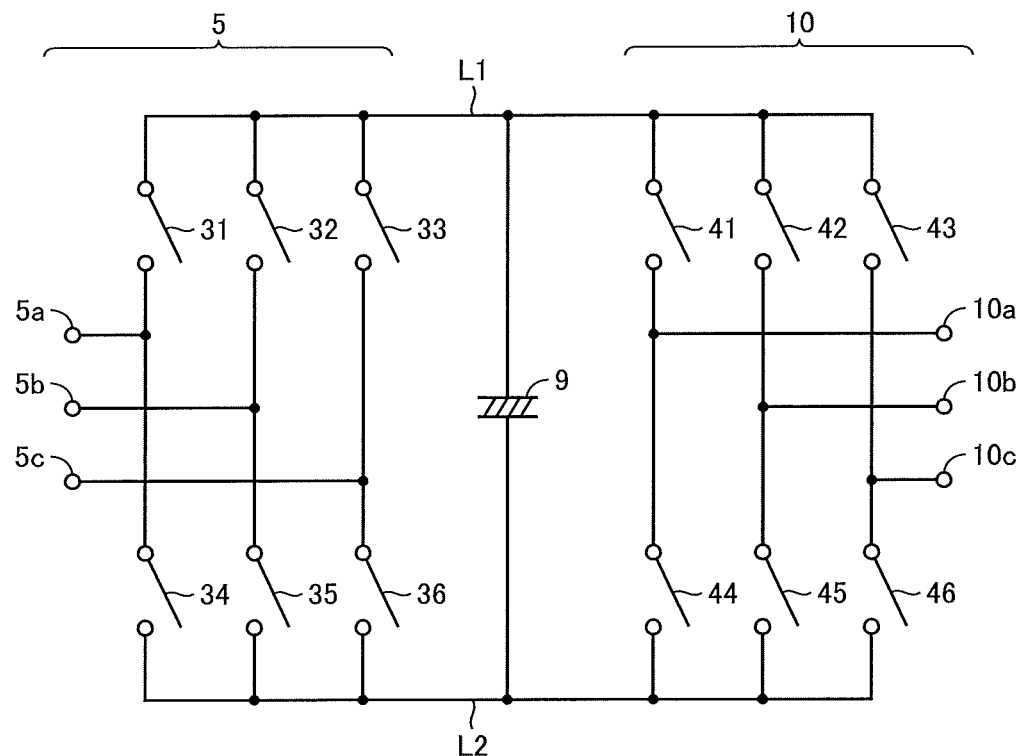
FIG.6
(a)
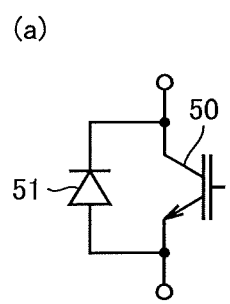
(b)
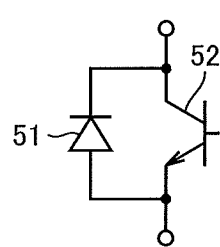

UNINTERRUPTIBLE POWER SUPPLY APPARATUS

TECHNICAL FIELD

The present invention relates to an uninterruptible power supply apparatus, and more particularly to an uninterruptible power supply apparatus including a converter configured to convert AC power supplied from a commercial AC power source into DC power, and including an inverter configured to convert DC power into AC power and supply the converted power to a load.

BACKGROUND ART

For example, Japanese Patent Laying-Open No. 2010-124557 (PTD 1) discloses an uninterruptible power supply apparatus including a converter, an inverter, and a DC step-up/step-down device. The converter converts AC power supplied from a commercial AC power source into DC power. The inverter converts DC power into AC power and supplies the converted power to a load. During a normal time when AC power is supplied from the commercial AC power source, the DC step-up/step-down device supplies DC power produced in the converter to a storage battery, and during a power failure time when a supply of AC power from the commercial AC power source is stopped, the DC step-up/step-down device supplies DC power from the storage battery to the inverter. Thus, in the case of a power failure, the operation of the load can be continued as long as DC power is stored in the storage battery.

CITATION LIST

Patent Document

PTD 1: Japanese Patent Laying-Open No. 2010-124557

SUMMARY OF INVENTION

Technical Problem

Such an uninterruptible power supply apparatus is configured to output a constant rated voltage and have the maximum efficiency when a ratio of load capacity to rated capacity is a predetermined value (e.g. 60%). Accordingly, a conventional uninterruptible power supply apparatus has a problem of having lower efficiency than a maximum value depending on the load capacity.

A main object of the present invention, therefore, is to provide an uninterruptible power supply apparatus having high efficiency.

Solution to Problem

An uninterruptible power supply apparatus according to the present invention includes a converter configured to convert AC power supplied from a commercial AC power source into DC power, and an inverter configured to convert DC power into AC power and supply the converted power to a load. During a normal time when AC power is supplied from the commercial AC power source, DC power generated in the converter is supplied to the inverter and is stored in a power storage device, and during a power failure time when a supply of AC power from the commercial AC power source is stopped, DC power in the power storage device is supplied to the inverter. The load is configured to receive an AC voltage within a range of allowable input voltage to consume constant AC power. The uninterruptible power supply apparatus has maximum efficiency when a ratio of load capacity to rated capacity of the uninterruptible power supply apparatus is a predetermined value. The uninterruptible power supply apparatus further includes a control device configured to control an output voltage of the inverter within the range of allowable input voltage so as to increase the efficiency when the ratio of the load capacity to the rated capacity is different from the predetermined value.

Advantageous Effects of Invention

In the uninterruptible power supply apparatus according to the present invention, an output voltage of the inverter is controlled within a range of allowable input voltage of the load so as to increase the efficiency. Therefore, the efficiency can be enhanced compared to a conventional uninterruptible power supply apparatus where an output voltage of the inverter is fixed to a constant rated voltage.

BRIEF DESCRIPTION OF DRAWINGS

FIG. 5 is a circuit diagram showing major portions of an uninterruptible power supply apparatus according to Embodiment 2 of the present invention.

FIG. 6 shows circuit diagrams illustrating configurations of switching elements shown in FIG. 5.

DESCRIPTION OF EMBODIMENTS

Embodiment 1

Figure 1:
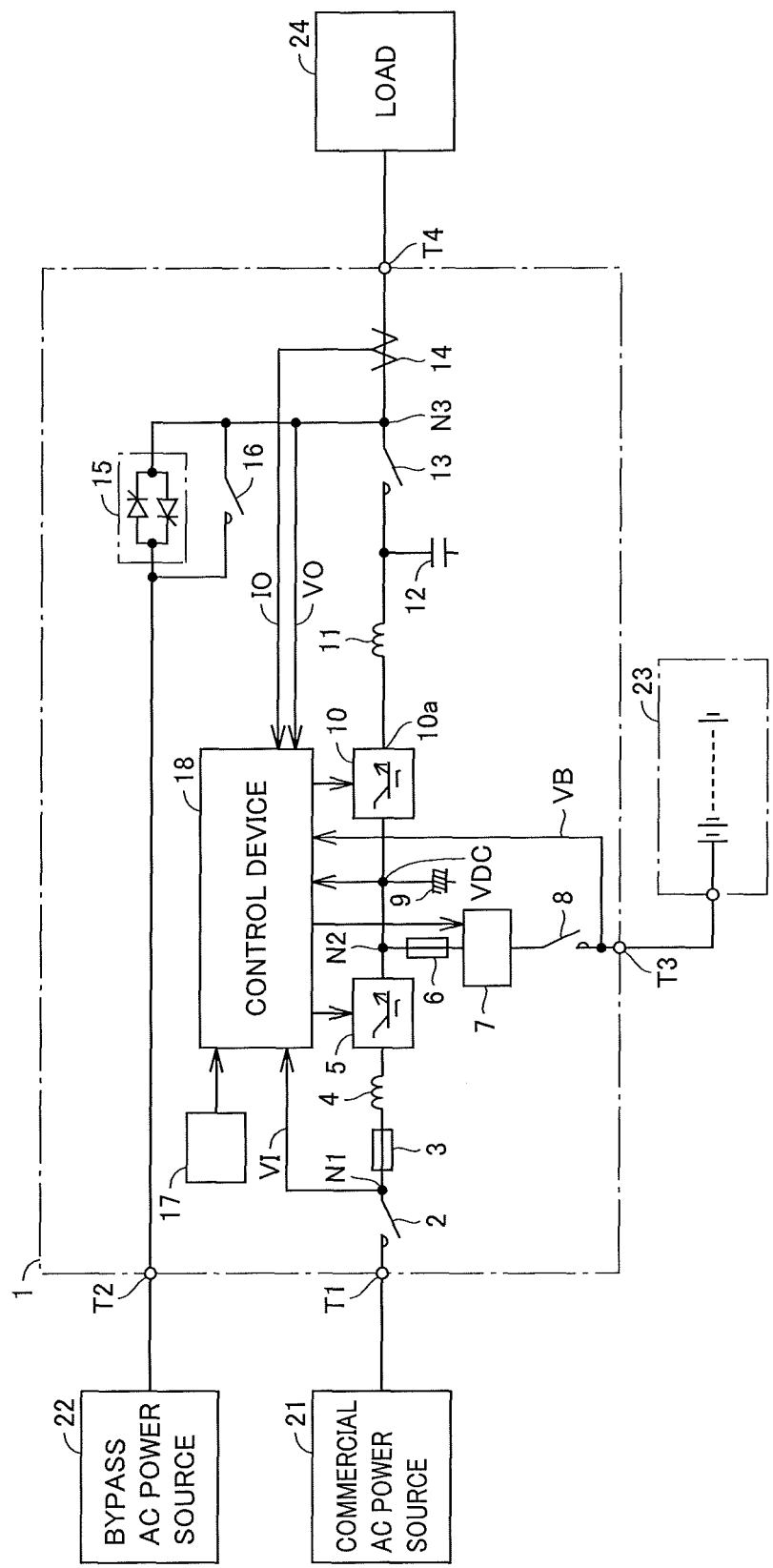
FIG. 1 is a circuit block diagram showing a configuration of an uninterruptible power supply apparatus according to Embodiment 1 of the present invention.

FIG. 1 is a circuit block diagram showing a configuration of an uninterruptible power supply apparatus 1 according to Embodiment 1 of the present invention. Uninterruptible power supply apparatus 1 converts three-phase AC power from a commercial AC power source 21 into DC power, and then converts the DC power into three-phase AC power to supply the converted power to a load 24. FIG. 1, however, shows a circuit for only a single phase for simplicity of the drawing and the explanation.

In FIG. 1, uninterruptible power supply apparatus 1 includes an AC input terminal T1, a bypass input terminal T2, a battery terminal T3, and an AC output terminal T4. AC input terminal T1 receives AC power having a commercial frequency from commercial AC power source 21. Bypass input terminal T2 receives AC power having a commercial frequency from a bypass AC power source 22. Bypass AC power source 22 may be a commercial AC power source or may be a power generator.

Battery terminal T3 is connected to a battery (power storage device) 23. Battery 23 stores DC power. A capacitor may be connected instead of battery 23. AC output terminal T4 is connected to load 24. Load 24 is driven with AC power.

Uninterruptible power supply apparatus 1 further includes electromagnetic contactors 2, 8, 13, 16, protective fuses 3, 6, AC reactors 4, 11, a converter 5, a bidirectional chopper 7, a smoothing electrolytic capacitor 9, an inverter 10, a capacitor 12, a current detector 14, a semiconductor switch 15, an operation unit 17, and a control device 18.

Electromagnetic contactor 2, protective fuse 3, and AC reactor 4 are connected in series between AC input terminal T1 and an input node of converter 5. Electromagnetic contactor 2 is ON during use of uninterruptible power supply apparatus 1, and is OFF during, for example, maintenance of uninterruptible power supply apparatus 1. An instantaneous value of an AC input voltage VI appearing at a node N1 between electromagnetic contactor 2 and protective fuse 3 is detected by control device 18. Whether a power failure has occurred, for example, is determined based on a detected value of AC input voltage VI.

Protective fuse 3 is blown to protect uninterruptible power supply apparatus 1 and other components if an overcurrent flows. AC reactor 4 constitutes a low-pass filter which allows AC power having a commercial frequency to pass from commercial AC power source 21 to converter 5 and which prevents a signal having a switching frequency generated in converter 5 from passing to commercial AC power source 21.

Converter 5 is a forward converter and is controlled by control device 18. During a normal time when AC power is supplied from commercial AC power source 21, converter 5 converts AC power into DC power and outputs the converted power to a power source node N2. During a power failure time when a supply of AC power from commercial AC power source 21 is stopped, the operation of converter 5 is stopped. An output voltage of converter 5 can be controlled to be a desired value. Smoothing electrolytic capacitor 9 is connected to power source node N2 and smoothes a voltage of power source node N2. An instantaneous value of DC voltage VDC appearing at power source node N2 is detected by control device 18.

Protective fuse 6 is connected between power source node N2 and a high voltage node of bidirectional chopper 7 and is blown to protect uninterruptible power supply apparatus 1, battery 23, and other components if an overcurrent flows. A low voltage node of bidirectional chopper 7 is connected to battery terminal T3 through electromagnetic contactor 8. Electromagnetic contactor 8 is ON during use of uninterruptible power supply apparatus 1, and is OFF during, for example, maintenance of uninterruptible power supply apparatus 1 and battery 23. An instantaneous value of an inter-terminal voltage VB of battery 23 appearing at battery terminal T3 is detected by control device 18.

Bidirectional chopper 7 is a DC step-up/step-down circuit and is controlled by control device 18. During a normal time when AC power is supplied from commercial AC power source 21, bidirectional chopper 7 stores DC power generated by converter 5 in battery 23. During a power failure time when a supply of AC power from commercial AC power source 21 is stopped, bidirectional chopper 7 supplies DC power in battery 23 to inverter 10 through power source node N2.

When storing DC power in battery 23, bidirectional chopper 7 drops DC voltage VDC of power source node N2 to a DC voltage having a predetermined value and provides the dropped voltage to battery 23. When supplying DC power of battery 23 to inverter 10, bidirectional chopper 7 raises inter-terminal voltage VB of battery 23 to a DC voltage having a predetermined value and outputs the raised voltage to power source node N2. Power source node N2 is connected to an input node of inverter 10.

Inverter 10 is a reverse converter controlled by control device 18. Inverter 10 converts DC power supplied from converter 5 or bidirectional chopper 7 through power source node N2 into AC power having a commercial frequency and outputs the converted power to an output node 10a. That is, during a normal time, inverter 10 converts DC power supplied from converter 5 through power source node N2 into AC power, and during a power failure time, inverter 10 converts DC power supplied from battery 23 through bidirectional chopper 7 into AC power. An output voltage of inverter 10 can be controlled to be a desired value.

Output node 10a of inverter 10 is connected to one terminal of electromagnetic contactor 13 through AC reactor 11. The other terminal (node N3) of electromagnetic contactor 13 is connected to AC output terminal T4. Capacitor 12 is connected to one terminal of electromagnetic contactor 13. AC reactor 11 and capacitor 12 constitute a low-pass filter which allows AC power having a commercial frequency generated in inverter 10 to pass to AC output terminal T4 and which prevents a signal having a switching frequency generated in inverter 10 from passing to AC output terminal T4.

Electromagnetic contactor 13 is controlled by control device 18. Electromagnetic contactor 13 is ON during an inverter power feeding mode in which AC power generated by inverter 10 is supplied to load 24. Electromagnetic contactor 13 is OFF during a bypass power feeding mode in which AC power from bypass AC power source 22 is supplied to load 24.

An instantaneous value of an AC output voltage VO appearing at node N3 is detected by control device 18. Current detector 14 detects a load current IO flowing between node N3 and AC output terminal T4 and provides a signal representing the detected value to control device 18.

Semiconductor switch 15 includes a thyristor and is connected between bypass input terminal T2 and node N3. Electromagnetic contactor 16 is connected in parallel to semiconductor switch 15. Semiconductor switch 15 is controlled by control device 18. Semiconductor switch 15 is normally OFF, and, in the case of a malfunction of inverter 10, semiconductor switch 15 is instantaneously turned ON so that AC power from bypass AC power source 22 is supplied to load 24. Semiconductor switch 15 is turned OFF after a lapse of a predetermined period of time since semiconductor switch 15 was turned ON.

Electromagnetic contactor 16 is OFF during the inverter power feeding mode in which AC power generated by inverter 10 is supplied to load 24. Electromagnetic contactor 16 is ON during the bypass power feeding mode in which AC power from bypass AC power source 22 is supplied to load 24. In the case of a malfunction of inverter 10, electromagnetic contactor 16 is turned ON so that AC power from bypass AC power source 22 is supplied to load 24. That is, in the case of a malfunction of inverter 10, semiconductor switch 15 is instantaneously turned ON and remains ON for a predetermined period of time and electromagnetic contactor 16 is turned ON. This is for preventing semiconductor switch 15 from being overheated and damaged.

Operation unit 17 includes components, such as a plurality of buttons to be operated by a user of uninterruptible power supply apparatus 1, and an image display to display various pieces of information. User's operation of operation unit 17 allows power-on/power-off of uninterruptible power supply apparatus 1, allows selection of one of the modes including the bypass power feeding mode, the inverter power feeding mode, a rated voltage output mode (described below), and an output voltage control mode (described below), and allows storage of various parameters in control device 18.

Control device 18 operates based on signals from operation unit 17, detects instantaneous values of AC input voltage VI, DC voltage VDC, battery voltage VB, AC output voltage VO, and load current IO, and controls the overall uninterruptible power supply apparatus 1 based on the detected values. That is, based on a detected value of AC input voltage VI, control device 18 determines whether a power failure has occurred and controls converter 5 and inverter 10 in synchronization with phase of AC input voltage VI.

Further, control device 18 controls converter 5 so that DC voltage VDC is a desired target DC voltage VDCT, and controls bidirectional chopper 7 so that battery voltage VB is a desired target battery voltage VBT. Further, when the rated voltage output mode is selected by using operation unit 17, control device 18 controls inverter 10 so that output voltage VO is a constant rated voltage.

Figure 2:
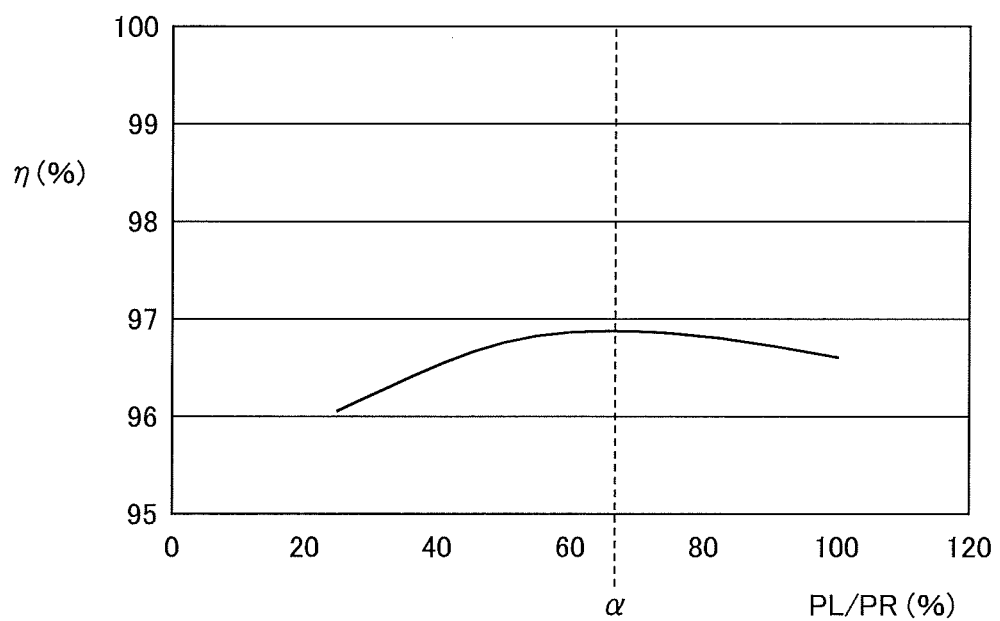
FIG. 2 shows a relationship between ratio of load capacity to rated capacity of the uninterruptible power supply apparatus shown in FIG. 1, and efficiency of the uninterruptible power supply apparatus.

Further, when the output voltage control mode is selected by using operation unit 17, control device 18 controls output voltage VO so as to enhance efficiency of uninterruptible power supply apparatus 1. FIG. 2 shows a relationship between ratio PL/PR (%) of load capacity PL to rated capacity PR of uninterruptible power supply apparatus 1, and efficiency η (%) of uninterruptible power supply apparatus 1. Efficiency η is ratio PO/PI (%) of AC power PO that is supplied to load 24, to AC power PI that is supplied from commercial AC power source 21.

With reference to FIG. 2, when ratio PL/PR (%) of load capacity PL to rated capacity PR is a predetermined value α (about 65% in FIG. 2), efficiency η of uninterruptible power supply apparatus 1 is a maximum value ηmax. Efficiency η gradually decreases as PL/PR increases relative to predetermined value α, and gradually decreases as PL/PR decreases relative to predetermined value α.

The reason why efficiency η has a peak value ηmax is that a higher load current IO leads to a larger power consumption in resistance components, such as AC reactors 4, 11, whereas a lower load current IO leads to a higher ratio of consumption current of control device 18 to load current IO. Thus, the horizontal axis in FIG. 2 can be replaced with ratio IO/IR (%) of load current IO to rated current IR of uninterruptible power supply apparatus 1. Further, since rated current IR is constant, the horizontal axis in FIG. 2 can be replaced with value of load current IO and α can be replaced with a predetermined value IOα of load current IO.

Accordingly, when power consumption of load 24 is kept constant and PL/PR is lower than predetermined value α, efficiency η can be enhanced by decreasing output voltage VO within a range of allowable input voltage of load 24 and by increasing load current IO within a range with an upper limit of IOα.

Further, when power consumption of load 24 is kept constant and PL/PR is higher than predetermined value α, efficiency η can be enhanced by increasing output voltage VO within a range of allowable input voltage of load 24 and by decreasing load current IO within a range with a lower limit of IOα. Accordingly, in Embodiment 1, when the output voltage control mode is selected, output voltage VO is controlled within a range of allowable input voltage of load 24 to enhance efficiency η.

Figure 3:
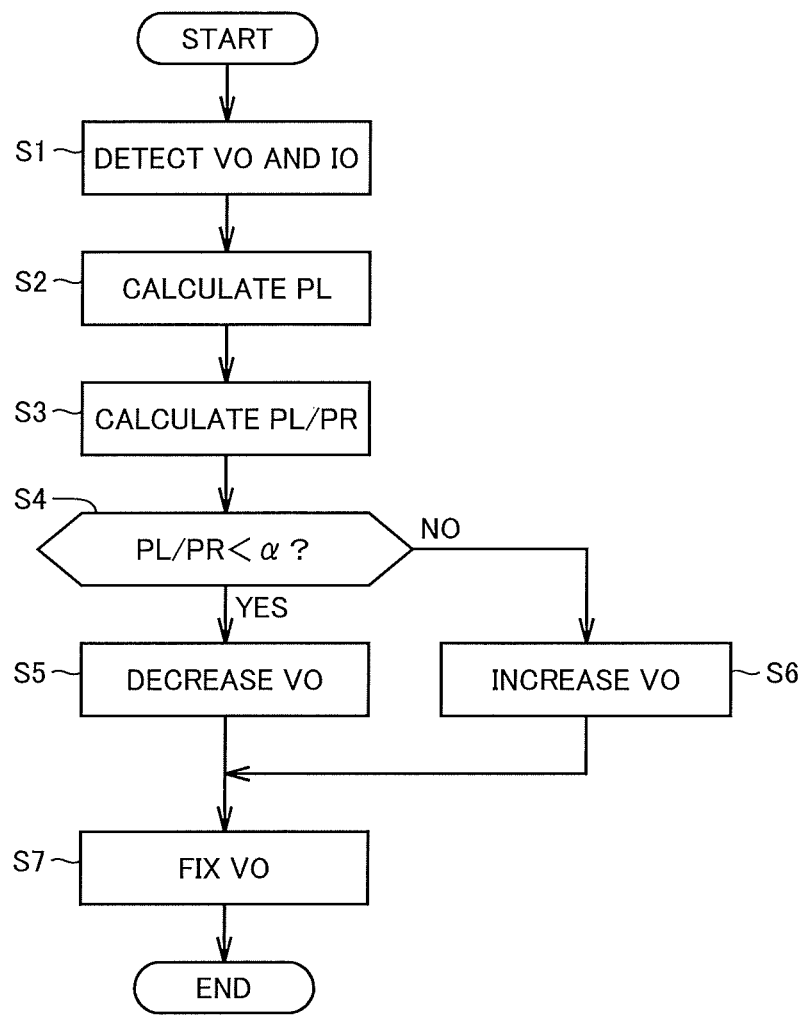
FIG. 3 is a flowchart showing the operations during an output voltage control mode of a control device shown in FIG. 1.

FIG. 3 is a flowchart showing the operations of control device 18 during the output voltage control mode. Here, the mode has been switched from the rated voltage output mode to the output voltage control mode by a user of uninterruptible power supply apparatus 1 operating operation unit 17. Accordingly, control device 18 detects output voltage VO and load current IO in Step S1, calculates load capacity PL based on the detected values of VO and IO in Step S2, and calculates PL/PR in Step S3.

In Step S4, control device 18 determines whether PL/PR is lower than predetermined value α. If PL/PR<α, control device 18 goes on to Step S5, whereas if PL/PR>α, control device 18 goes on to Step S6.

In Step S5, control device 18 decreases output voltage VO within a range of allowable input voltage of load 24 and increases load current IO within a range with an upper limit of IOα. In Step S6, control device 18 increases output voltage VO within a range of allowable input voltage of load 24 and decreases load current IO within a range with a lower limit of IOα. In Step S7, control device 18 fixes output voltage VO and continues the operation of load 24.

Rated capacity PR, predetermined value α, IOα, and a range of allowable input voltage of load 24 are stored in control device 18 in advance.

For example, where PL/PR and efficiency η are in the relationship shown in FIG. 2, when PL/PR is 45%, PL/PR can be increased to 55% by decreasing output voltage VO by 10% and by increasing load current IO by 10%. Efficiency η can thus be enhanced.

Next, the operations of uninterruptible power supply apparatus 1 are described. During a normal time when AC power is supplied from commercial AC power source 21, electromagnetic contactors 2, 8, 13 are ON and semiconductor switch 15 and electromagnetic contactor 16 are OFF. AC power supplied from commercial AC power source 21 is converted into DC power by converter 5. DC power generated by converter 5 is stored in battery 23 by bidirectional chopper 7 and is converted into AC power by inverter 10 to be supplied to load 24.

When the output voltage output mode is selected by using operation unit 17, output voltage VO of uninterruptible power supply apparatus 1 is kept at a constant rated voltage. When the output voltage control mode is selected by using operation unit 17, output voltage VO is controlled so that efficiency η of uninterruptible power supply apparatus 1 is increased. That is, when PL/PR is lower than predetermined value α, output voltage VO is decreased within a range of allowable input voltage of load 24, whereas when PL/PR is higher than predetermined value α, output voltage VO is increased within a range of allowable input voltage of load 24. Efficiency η of uninterruptible power supply apparatus 1 is thus enhanced.

During a power failure time when a supply of AC power from commercial AC power source 21 is stopped, the operation of converter 5 is stopped and DC power in battery 23 is supplied to inverter 10 by bidirectional chopper 7. Inverter 10 converts DC power supplied from battery 23 through bidirectional chopper 7 into AC power, and supplies the converted power to load 24. Accordingly, in the case of a power failure, the operation of load 24 can be continued as long as DC power is stored in battery 23.

In the case of a malfunction of inverter 10 during a normal time, semiconductor switch 15 is instantaneously turned ON and AC power is supplied from bypass AC power source 22 through semiconductor switch 15 to load 24. Then, electromagnetic contactor 16 is turned ON, electromagnetic contactor 13 is turned OFF, and semiconductor switch 15 is turned OFF. This causes AC power to be supplied from bypass AC power source 22 through electromagnetic contactor 16 to load 24.

As described above, in Embodiment 1, output voltage VO of uninterruptible power supply apparatus 1 is controlled within a range of allowable input voltage of load 24 so that efficiency η of uninterruptible power supply apparatus 1 is increased. Therefore, efficiency η can be enhanced compared to a conventional uninterruptible power supply apparatus where output voltage VO is fixed to a constant rated voltage.

In Embodiment 1, DC voltage VDC of power source node N2 is set to predetermined target DC voltage VDCT. In the case where an amplitude value of AC input voltage VI is varied, however, DC voltage VDC may be varied in accordance with the variation in amplitude value of AC input voltage VI within a range which does not affect the generation of AC output voltage VO. That is, DC voltage VDC may be increased when an amplitude value of AC input voltage VI is increased, whereas DC voltage VDC may be decreased when an amplitude value of AC input voltage VI is decreased.

Figure 4:
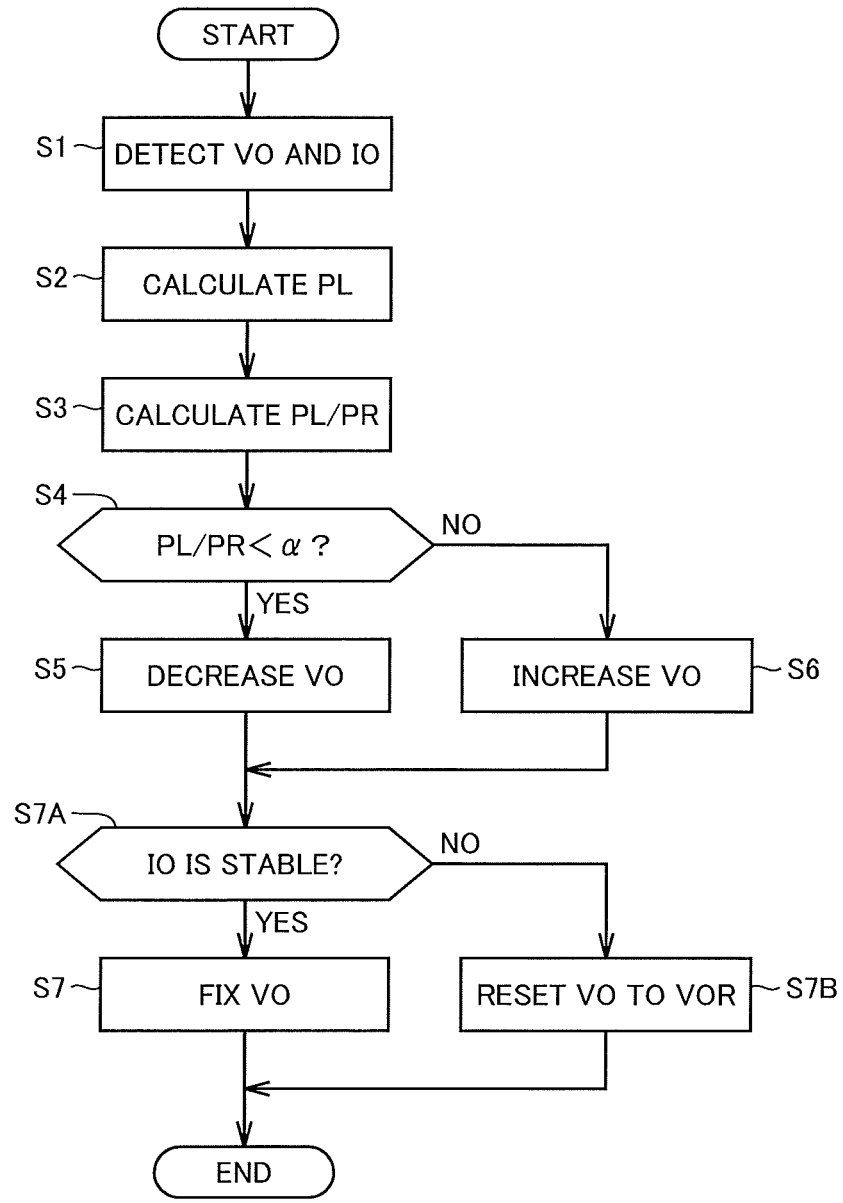
FIG. 4 is a flowchart showing a modification of Embodiment 1.

FIG. 4 is a flowchart showing a modification of Embodiment 1, FIG. 4 being contrasted with FIG. 3. With reference to FIG. 4, the modification is different from Embodiment 1 in that the modification includes additional Steps S7A and S7B. After performing Steps S1 to S6, control device 18 determines whether load current IO has a stable constant value in Step S7A. If determining that load current IO has a stable constant value, control device 18 fixes output voltage VO in Step S7 and continues the operation of load 24. If determining that load current IO does not have a stable constant value, control device 18 resets output voltage VO to rated voltage VOR in Step S7B and continues the operation of load 24.

The modification can bring about the same advantageous effects as those of Embodiment 1, and additionally can stabilize load current IO by resetting output voltage VO to rated voltage VOR when output voltage VO is increased or decreased and load current IO becomes unstable.

Embodiment 2

In Embodiment 1, during the output voltage control mode, output voltage VO is controlled to increase efficiency η when ratio PL/PR (%) of load capacity PL to rated capacity PR of uninterruptible power supply apparatus 1 is different from predetermined value α. In Embodiment 2, efficiency η is further increased by decreasing DC voltage VDC when output voltage VO is decreased. The reason why a decrease in DC voltage VDC can improve efficiency η is described below.

FIG. 5 is a circuit diagram showing a configuration of converter 5 and inverter 10. In FIG. 5, converter 5 includes input nodes 5a to 5c and switching elements 31 to 36, and inverter 10 includes switching elements 41 to 46 and output nodes 10a to 10c.

Input nodes 5a to 5c of converter 5 respectively receive three-phase AC voltage from commercial AC power source 21. Switching elements 31 to 33 each have one electrode connected to a DC positive bus L1 and the other electrode connected to corresponding one of input nodes 5a to 5c. Switching elements 34 to 36 each have one electrode connected to corresponding one of input nodes 5a to 5c, and the other electrode connected to DC negative bus L2. Smoothing electrolytic capacitor 9 is connected between DC positive bus L1 and DC negative bus L2 and smoothes DC voltage VDC between buses L1 and L2.

Switching elements 41 to 43 of inverter 10 each have one electrode connected to DC positive bus L1 and the other electrode connected to corresponding one of output nodes 10a to 10c. Switching elements 44 to 46 each have one electrode connected to corresponding one of output nodes 10a to 10c, and the other electrode connected to DC negative bus L2. To each of switching elements 31 to 36 and 41 to 46, a diode is connected in anti-parallel. The diodes, however, are not shown for simplicity of the drawing and the explanation.

Each of switching elements 31 to 36 and 41 to 46 is controlled by control device 18 and is turned ON/OFF at predetermined timing in synchronization with three-phase AC voltage VI from commercial AC power source 21. Switching elements 31 to 33 are turned ON/OFF in synchronization with three-phase AC voltage VI, and switching elements 34 to 36 are turned OFF/ON when switching elements 31 to 33 are turned ON/OFF, respectively. Switching elements 41 to 43 are turned ON/OFF in synchronization with three-phase AC voltage VI, and switching elements 44 to 46 are turned OFF/ON when switching elements 41 to 43 are turned ON/OFF, respectively.

DC voltage VDC can be adjusted to a desired voltage by adjusting a phase difference between the three-phase AC voltage from commercial AC power source 21 and the timing at which switching elements 31 to 36 are turned ON/OFF. Output voltage VO can be adjusted to a desired voltage by adjusting a period of time for which each of switching elements 41 to 46 is ON. Since an amplitude voltage of output AC voltage VO is lower than or equal to DC voltage VDC, DC voltage VDC can be decreased when an amplitude voltage of output AC voltage VO is decreased.

Accordingly, when decreasing output voltage VO in order to increase efficiency η, control device 18 decreases DC voltage VDC as well in accordance with output voltage VO. That is, control device 18 decreases DC voltage VDC by adjusting the timing at which switching elements 31 to 36 are turned ON/OFF, and decreases output voltage VO by adjusting a period of time for which each of switching elements 41 to 46 is ON. A decrease in DC voltage VDC can reduce losses to be produced at switching elements 31 to 36 and 41 to 46.

That is, as shown in FIG. 6(a), (b), each of switching elements 31 to 36 and 41 to 46 is constituted of an insulated gate bipolar transistor (IGBT) 50, an NPN bipolar transistor 52, or the like. To each IGBT 50 or transistor 52, a diode 51 is connected in anti-parallel.

Figure 7:
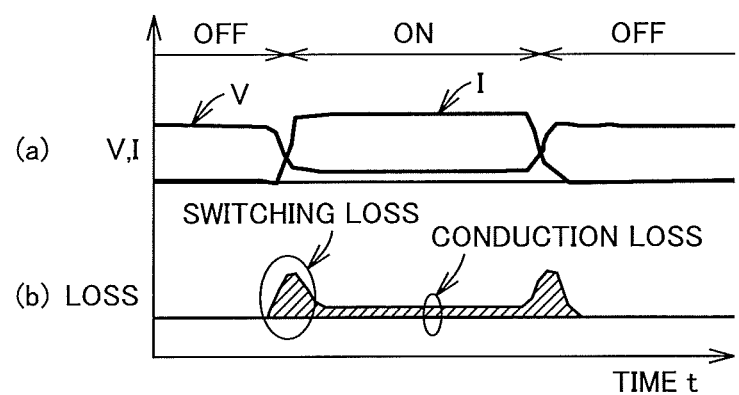
FIG. 7 is a time chart showing losses produced at the IGBT shown in FIG. 6.

FIG. 7(a), (b) is a time chart showing the ON/OFF operations of IGBT 50. FIG. 7(a) shows collector-emitter voltage V and emitter current I of IGBT 50. FIG. 7(b) shows losses produced at IGBT 50.

As shown in FIG. 7(a), (b), during a period when IGBT 50 is OFF, a resistance value of IGBT 50 is high enough for current I to be 0 A. Thus, no loss is produced at IGBT 50. During a period when IGBT 50 is ON, however, large current I flows through IGBT 50 and a resistance value of IGBT 50 is not 0Ω, leading to production of a conduction loss at IGBT 50.

When IGBT 50 is switched from an OFF state to an ON state or from an ON state to an OFF state, it takes a certain period of time for voltage V and current I to change, causing a switching loss V×I. Decreases in DC voltage VDC and in collector-emitter voltage V of IGBT 50 can lead to reduction in switching loss V×I. Since IGBT 50 is turned ON/OFF with high frequency in converter 5 and inverter 10, the reduction in switching loss provides great advantageous effects.

As described above, Embodiment 2 can bring about the same advantageous effects as those of Embodiment 1, and additionally can reduce losses in converter 5 and inverter 10 and thus can further enhance efficiency η since DC voltage VDC is decreased in accordance with output voltage VO when output voltage VO is decreased.

The embodiments disclosed here should be considered illustrative in all respects, not limitative. It is intended that the scope of the present invention is defined not by the above description but by the claims, and that the scope of the invention includes all the modifications in the meaning and scope equivalent to the claims.

REFERENCE SIGNS LIST

1: uninterruptible power supply apparatus; T1: AC input terminal; T2: bypass input terminal; T3: battery terminal; T4: AC output terminal; 2, 8, 13, 16: electromagnetic contactor; 3, 6: protective fuse; 4, 11: AC reactor; 5: converter; 7: bidirectional chopper; 9: smoothing electrolytic capacitor; 10: inverter; 12: capacitor; 14: current detector; 15: semiconductor switch; 17: operation unit; 18: control device; 21: commercial AC power source; 22: bypass AC power source; 23: battery; 24: load; 31-36, 41-46: switching element; 50: IGBT, 51: diode; 52: NPN bipolar transistor

The invention claimed is:

1. An uninterruptible power supply apparatus comprising:
a converter configured to convert AC power supplied from a commercial AC power source into DC power; and
an inverter configured to convert DC power into AC power and supply the converted power to a load,
during a normal time when AC power is supplied from the commercial AC power source, DC power generated in the converter being supplied to the inverter and stored in a power storage device, and during a power failure time when a supply of AC power from the commercial AC power source is stopped, DC power in the power storage device being supplied to the inverter,
the load being configured to receive an AC voltage within a range of allowable input voltage to consume constant AC power,
the uninterruptible power supply apparatus having maximum efficiency when a ratio of load capacity to rated capacity of the uninterruptible power supply apparatus is a predetermined value,
the uninterruptible power supply apparatus further comprising a control device configured to control an output voltage of the inverter within the range of allowable input voltage so as to increase the efficiency, when the ratio of the load capacity to the rated capacity is different from the predetermined value.

2. The uninterruptible power supply apparatus according to claim 1, wherein the control device is configured to decrease the output voltage of the inverter within the range of allowable input voltage of the load and increase a load current so as to increase the efficiency, when the ratio of the load capacity to the rated capacity is lower than the predetermined value.

3. The uninterruptible power supply apparatus according to claim 2, wherein the control device is configured to decrease the output voltage of the inverter and decrease an output voltage of the converter.

4. The uninterruptible power supply apparatus according to claim 1, wherein the control device is configured to increase the output voltage of the inverter within the range of allowable input voltage and decrease a load current so as to increase the efficiency, when the ratio of the load capacity to the rated capacity is higher than the predetermined value.

5. The uninterruptible power supply apparatus according to claim 1, wherein
the uninterruptible power supply apparatus has
an output voltage control mode in which the output voltage of the inverter is controlled within the range of allowable input voltage so that the efficiency is increased, when the ratio of the load capacity to the rated capacity is different from the predetermined value, and
a rated voltage output mode in which the output voltage of the inverter is kept at a rated voltage, and
the control device is configured to perform a selected one of the output voltage control mode and the rated voltage output mode.

6. The uninterruptible power supply apparatus according to claim 1, wherein the control device is configured to set the output voltage of the inverter to a rated voltage when the control device controls the output voltage of the inverter and a load current is varied.

7. The uninterruptible power supply apparatus according to claim 1, wherein the control device is configured to vary an output voltage of the converter in accordance with a variation in AC voltage from the commercial AC power source.

8. The uninterruptible power supply apparatus according to claim 1, further comprising a bidirectional chopper configured to supply DC power generated in the converter to the power storage device during the normal time, and configured to supply DC power in the power storage device to the inverter during the power failure time.

* * * * *